United States Patent [19]
Carlin

[11] Patent Number: 5,859,592
[45] Date of Patent: Jan. 12, 1999

[54] REDUCED CURRENT CONSUMPTION CIRCUIT FOR LED DEVICES

[75] Inventor: Charles Kevin Carlin, Clayton, N.C.

[73] Assignee: Square D Company, Palatine, Ill.

[21] Appl. No.: 748,262

[22] Filed: Nov. 13, 1996

[51] Int. Cl.⁶ .................................................. G08B 5/22
[52] U.S. Cl. ................... 340/815.45; 340/635; 340/815.4
[58] Field of Search ........................... 340/815.4, 815.45, 340/500, 635; 200/21.02; 250/208.4; 385/16, 23

[56] References Cited

U.S. PATENT DOCUMENTS

| | | | |
|---|---|---|---|
| 4,990,895 | 2/1991 | Juds | 340/635 |
| 5,136,280 | 8/1992 | Heggli | 340/644 |
| 5,754,112 | 5/1998 | Novak | 340/635 |

*Primary Examiner*—Brent A. Swarthout
*Attorney, Agent, or Firm*—Larry I. Golden; David R. Stacey; Larry T. Shrout

[57] ABSTRACT

A reduced current consumption circuit for multiple optical switches 10 having associated status indicator LEDs 26. The reduced current consumption is achieved by electrically connecting the emitter IREDs 14 of each optical switch 10 in series with the status indicator LEDs 26 and a constant current source Ccs 12. Each status indicator LED 26 includes a shunting circuit 34 which removes the LED 26 from the series circuit in response to an output signal from the receiver 18 of its associated optical switch 10 without breaking the series circuit.

10 Claims, 2 Drawing Sheets

REDUCED CURRENT CONSUMPTION CIRCUIT FOR LED DEVICES

FIELD OF THE INVENTION

The present invention relates to the field of electrical circuits for optical switches and particularly to a low current consumption circuit.

BACKGROUND OF THE INVENTION

In the electronics field and in particular the areas of sensors and control products the use of optical switches is expanding due to their special qualities. In many of control applications a visual power on indicator and visual switch status indicator is required for each optical switch. These indicators are usually in the form of light emitting diodes (LED's). It is common to place each switch status indicator LED in the sensor circuit of the switch for which it is to indicate the status. In this arrangement each status indicator LED consumes additional current thereby increasing the current required from the power supply. Therefore, the addition of only two or three indicator LED's can significantly increase the current consumption of a small solid state device. This additional current consumption can be a critical factor to the power supply design and size. It would therefore be an advantage to integrate the additional power ON and optical switch status indicator LED's into the optical switch emitter circuit and thereby keep current consumption to a minimum.

SUMMARY OF THE INVENTION

The present invention provides a circuit in which the power ON and optical switch status indicator LED's are arranged in series with the optical switch emitter circuit, thereby reducing the additional power consumption that these indicators would add to the solid state device. In this circuit each optical switch emitter, the power ON indicator LED and each optical switch output status indicator LED is electrically connected in a series circuit. Since each switch output LED must be able to turn ON or OFF independently of the other switch indicator LED's each indicator LED must have shunting circuit controlled by the optical switch output circuit. This shunting circuit effectively turns the LED off and removes it from the series circuit without breaking the circuit when the output of the optical switch with which it is associated is OFF. In the preferred embodiment, the optical switch emitter is an infrared emitting diode (IRED).

Other features and advantages of the invention will become apparent to those skilled in the art upon review of the following detailed description, claims and drawings.

Figure 1:
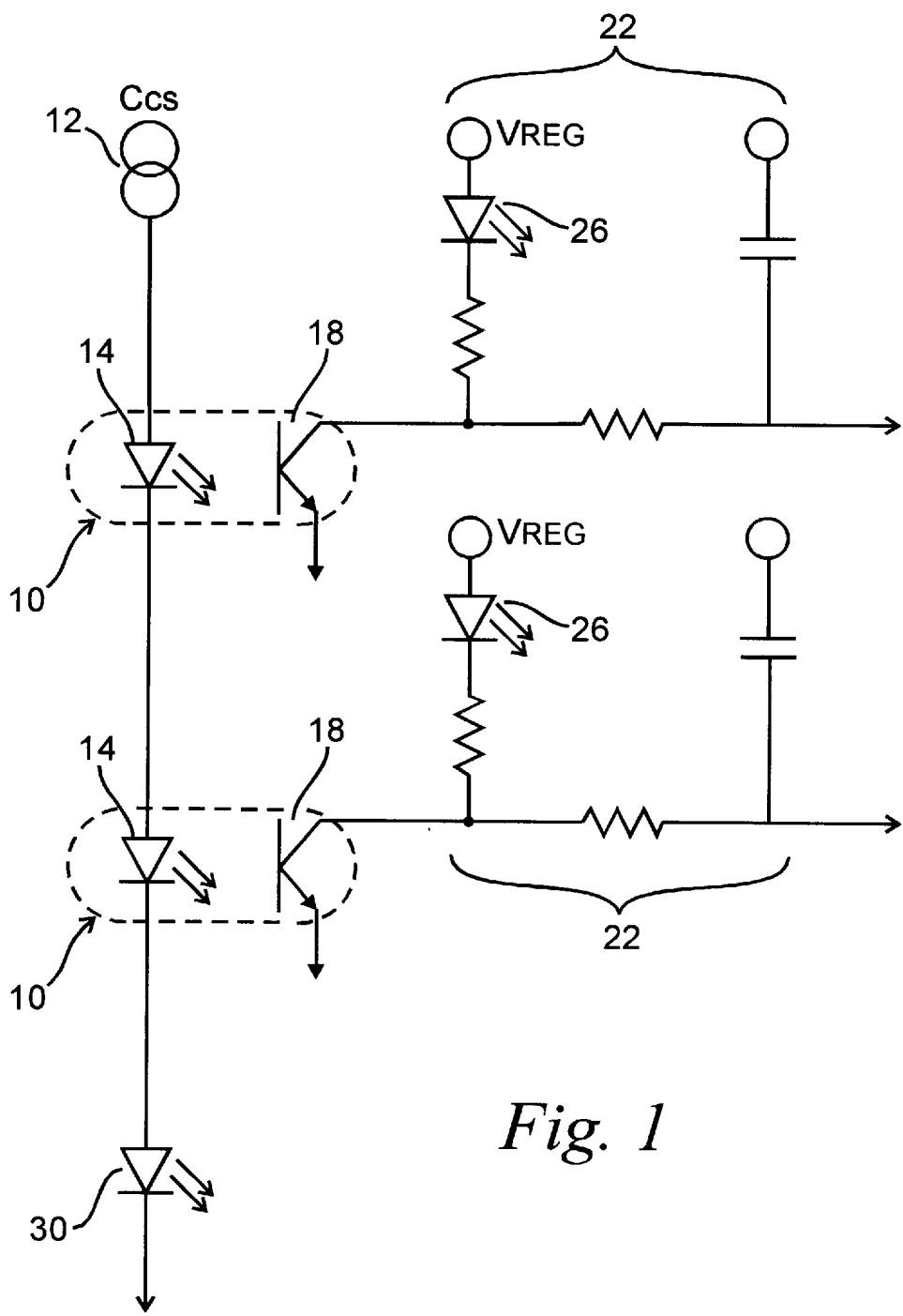
FIG. 1 is a circuit diagram for adding an optical switch status indicator LED to a the output circuit of an associated optical switch.

Before one embodiment of the invention is explained in detail, it is to be understood that the invention is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

FIG. 1 illustrates a circuit in which a number of optical switches 10, each with their emitter IREDs 14 connected in series with a constant current source Ccs 12. The receiver or sensor 18 of each optical switch 10 is connected to a detector circuit 22 which receives power from a regulated voltage supply Vreg. Each optical switch 10 has a status indicator LED 26 which is located in the detection circuit 22. When the output of the receiver 18 indicates that the switch is in an ON state the indicator LED 26 will be illuminated. When the output of the receiver 18 indicates that the switch is in an OFF state the indicator LED 26 will not be illuminated. When the indicator LED 26 is illuminated it will consume power from the detector circuit 22 which is generally in parallel with the series circuit of the emitter IREDs 14. Since these circuits are in parallel, the current consumption of the indicator LED's 26 is additional to that consumed by the emitter IRED's 14, thereby increasing the total current requirements of the optical switch device. A power ON indicator LED 30 is also connected in series with the emitters IREDs 14 although it could be connected in series with any circuit elements that would continuously have power when the optical switch device is operating.

Figure 2:
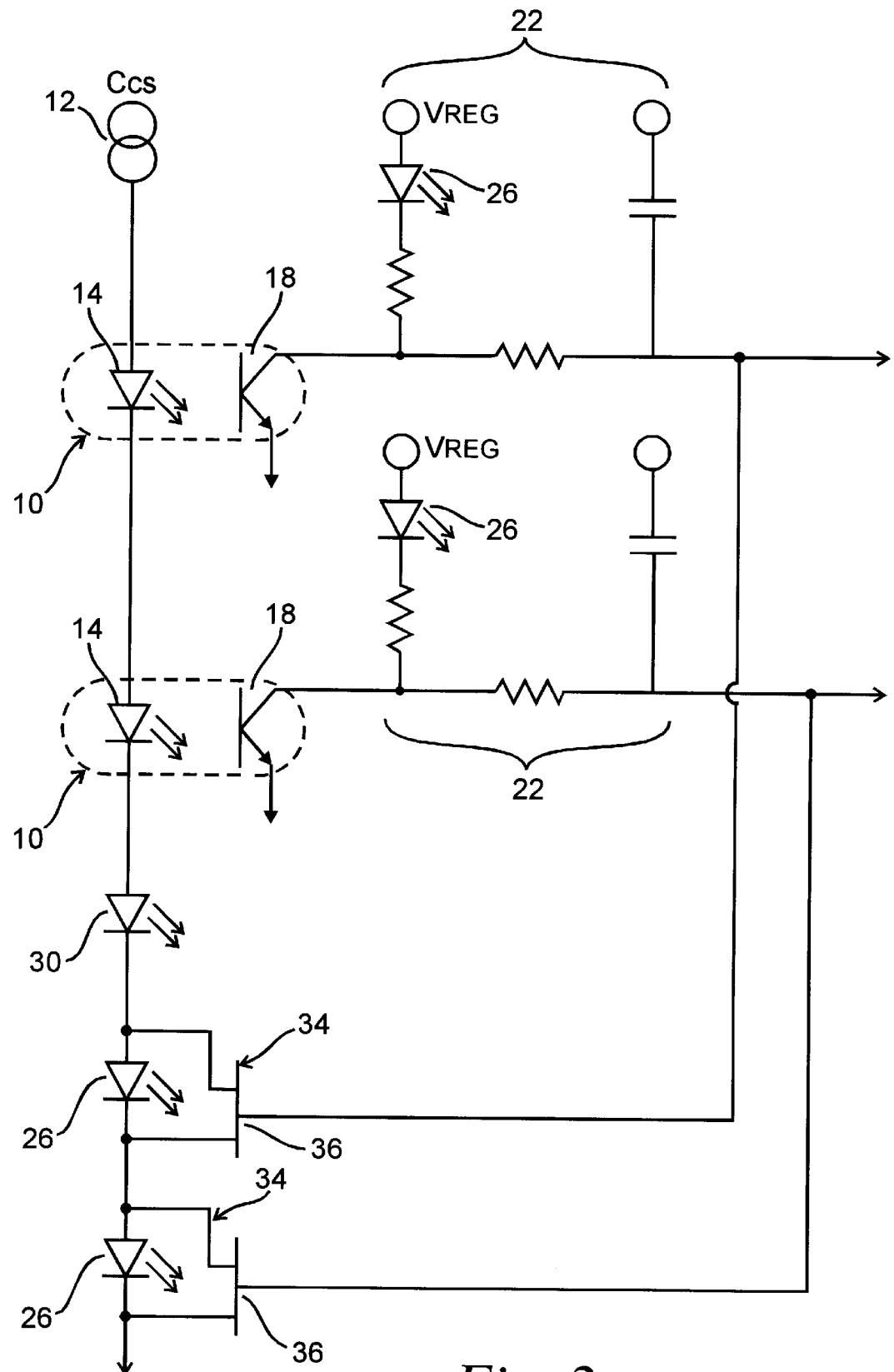
FIG. 2 is a circuit for placing a power ON status LED and optical switch status LED's in series with one another and with the optical switch emitter circuits they are associated with in accordance with the present invention.

FIG. 2 illustrates a reduced current consumption circuit in which the indicator LEDs 26 are arranged in series with the optical switch emitter IREDs 14 and the power ON indicator LED 30 in accordance with the present invention. In this circuit the emitter IREDs 14, switch status indicator LEDs 26 and the power ON indicator LED 30 are electrically connected in series with the constant current source Ccs. Since the indicator LEDs 26 must not be illuminated when the optical switch 10 with which they are associated is in the OFF state, each must be provided with a shunting circuit 34. The shunting circuit 34 effectively removes them from the constant current source Ccs series circuit without breaking that circuit. Each shunting circuit 34 includes a transistor 38 connected in parallel with the associated indicator LED 26 with its base connected to the output (collector) circuit of the receiver 18. The preferred embodiment of the transistor 38 is a gated N-FET transistor having its gate connected to the output circuit of the receiver 18 and its drain and source terminals connected across the anode and cathode terminals of the associated indicator LED 26. When the optical switch 10 is in the ON state, the output of the receiver 18 is low, turning the N-FET transistor 38 OFF and thereby letting current flow through the indicator LED 26. When the optical switch 10 is in the OFF state, the output of the receiver 18 is high, turning the N-FET transistor 38 ON and thereby diverting current flow from the indicator LED 26 through the drain to source path of the N-FET transistor 38. The transistor 38 could also be an NPN bipolar transistor having its gate connected to the output circuit of the receiver 18 through a voltage dropping resistor.

I claim:

1. A circuit for driving a plurality of optical switches and their associated status indicator LEDs, said circuit comprising:

a constant current source;

a plurality of optical switches each having an optical emitter and an optical receiver, said optical emitters being electrically connected in series with said constant current source;

a plurality of status indicator LEDs, each being associated with a particular one of said plurality of optical switches and each being electrically connected in series with said plurality of emitters and said constant current source; and a plurality of shunting circuits, each being associated with one of said plurality of status indicator LEDs and being electrically connected in parallel with said associated status indicator LED, each said shunting circuit being switchable from an inactive state wherein said associated status indicator LED is ON to an active state wherein said associated indicator LED is OFF in response to an output signal from said receiver of said optical switch associated with said status indicator LED.

2. The circuit of claim 1 wherein each said shunting circuit comprises a transistor.

3. The circuit of claim 2 wherein a base terminal of said transistor is electrically connected to an output terminal of said receiver of said optical switch associated with said status indicator LED.

4. The circuit of claim 3 wherein an emitter and a collector terminal of said transistor are connected in parallel with the terminals of said associated status indicator LED.

5. The circuit of claim 1 wherein each said shunting circuit comprises an N-FET transistor.

6. The circuit of claim 5 wherein a gate terminal of said N-FET transistor is electrically connected to an output terminal of said receiver of said optical switch associated with said status indicator LED.

7. The circuit of claim 6 wherein a source and a drain terminal of said N-FET transistor are connected to a cathode terminal and an anode terminal, respectively, of said associated status indicator LED.

8. The circuit of claim 1 wherein each said shunting circuit comprises an NPN bipolar transistor.

9. The circuit of claim 1 wherein each said optical switch emitter is an IRED.

10. The circuit of claim 1 wherein a power ON indicator LED is electrically connected in series with said plurality of emitters, said plurality of status indicator LEDs and said constant current source.

* * * * *